(12) United States Patent
Liaw

(10) Patent No.: US 12,106,801 B2
(45) Date of Patent: *Oct. 1, 2024

(54) CIRCUIT FOR REDUCING VOLTAGE DEGRADATION CAUSED BY PARASITIC RESISTANCE IN A MEMORY DEVICE

(71) Applicant: Taiwan Semiconductor Manufacturing Co., Ltd., Hsin-Chu (TW)

(72) Inventor: Jhon Jhy Liaw, Zhudong Township (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 168 days.

This patent is subject to a terminal disclaimer.

(21) Appl. No.: 17/858,376

(22) Filed: Jul. 6, 2022

(65) Prior Publication Data

US 2022/0343972 A1  Oct. 27, 2022

Related U.S. Application Data

(63) Continuation of application No. 17/234,276, filed on Apr. 19, 2021, now Pat. No. 11,430,508, which is a continuation of application No. 16/568,500, filed on Sep. 12, 2019, now Pat. No. 10,984,856.

(51) Int. Cl.
| | |
|---|---|
| *G11C 11/412* | (2006.01) |
| *G11C 11/419* | (2006.01) |
| *G11C 5/02* | (2006.01) |
| *G11C 7/10* | (2006.01) |
| *G11C 7/12* | (2006.01) |

(52) U.S. Cl.
CPC .......... *G11C 11/419* (2013.01); *G11C 11/412* (2013.01); *G11C 5/025* (2013.01); *G11C 7/1096* (2013.01); *G11C 7/12* (2013.01)

(58) Field of Classification Search
CPC ..... G11C 11/412; G11C 11/419; G11C 5/025; G11C 7/1096; G11C 7/12
USPC ........................................................ 365/156
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 10,984,856 B2 | 4/2021 | Liaw |
| 11,043,262 B2 | 6/2021 | Madhavan et al. |
| 2014/0032871 A1 | 1/2014 | Hsu et al. |
| 2014/0153321 A1 | 6/2014 | Liaw |

(Continued)

*Primary Examiner* — Ly D Pham
(74) *Attorney, Agent, or Firm* — HAYNES AND BOONE, LLP

(57) ABSTRACT

An array of memory cells is arranged into a plurality of columns and rows. A first signal line extends through a first column of the plurality of columns. The first signal line is electrically coupled to the memory cells in the first column. A first end portion of the first signal line is configured to receive a logic high signal from a first circuit during a first operational state of the memory device and a logic low signal from the first circuit during a second operational state of the memory device. A second circuit includes a plurality of transistors. The transistors are configured to be turned on or off to electrically couple a second end portion of the first signal line to a logic low source when the first end portion of the first signal line is configured to receive the logic low signal from the first circuit.

20 Claims, 9 Drawing Sheets

(56) References Cited

U.S. PATENT DOCUMENTS

| | | |
|---|---|---|
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2016/0240245 A1 | 8/2016 | Yang et al. |
| 2018/0294018 A1 | 10/2018 | Baeck et al. |
| 2019/0237135 A1 | 8/2019 | Madhavan et al. |
| 2021/0082494 A1 | 3/2021 | Liaw |

Fig. 7

|  | C1 | C2 | C3 | C4 |  |
|---|---|---|---|---|---|
| corner dummy cell 580 | edge cell 560 | edge cell 561 | edge cell 562 | edge cell 563 | corner dummy cell 590 |
| 581 edge cell | 510 cell | 520 cell | 530 cell | 540 cell | 591 edge cell |
| 582 edge cell | 511 cell | 521 cell | 531 cell | 541 cell | 592 edge cell |
| 583 edge cell | 512 cell | 522 cell | 532 cell | 542 cell | 593 edge cell |
| 584 edge cell | 513 cell | 523 cell | 533 cell | 543 cell | 594 edge cell |
| 585 edge cell | 514 cell | 524 cell | 534 cell | 544 cell | 595 edge cell |
| 586 edge cell | 515 cell | 525 cell | 535 cell | 545 cell | 596 edge cell |
| 587 edge cell | 516 cell | 526 cell | 536 cell | 546 cell | 597 edge cell |
| 588 edge cell | 517 cell | 527 cell | 537 cell | 547 cell | 598 edge cell |
| corner dummy cell 589 | edge cell 570 | edge cell 571 | edge cell 572 | edge cell 573 | corner dummy cell 599 |

500

R1, R2, R3, R4, R5, R6, R7, R8

CIRCUIT FOR REDUCING VOLTAGE DEGRADATION CAUSED BY PARASITIC RESISTANCE IN A MEMORY DEVICE

PRIORITY DATA

This present application is a continuation application of U.S. patent application Ser. No. 17/234,276, filed on Apr. 19, 2021, which is a continuation application U.S. patent application Ser. No. 16/568,500, filed Sep. 12, 2019, issued on Apr. 20, 2021 as U.S. Pat. No. 10,984,856, the disclosures of each which are hereby incorporated in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in memory devices such as Static Random Access Memory (SRAM) devices, it may be desirable to pack numerous SRAM cells in an array, so as to increase the array efficiency and/or to reduce the chip size. However, a long SRAM array may increase the parasitic resistance attributed to the metal routing. For example, a bit line (BL) or bit line bar (BLB) signal line of an SRAM array may produce a sufficiently high parasitic resistance, which will cause a voltage drop across the length of the BL or BLB signal line. In some cases, an SRAM cell the end of an SRAM array may experience a degraded logic high or low voltage for its BL or BLB signal line, which may worsen device performance.

Therefore, although conventional memory devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 7 illustrates the top view layout of SRAM cells and cells of the SRAM device of FIG. 6 according to various aspects of the present disclosure.

DETAILED DESCRIPTION

Figure 1:
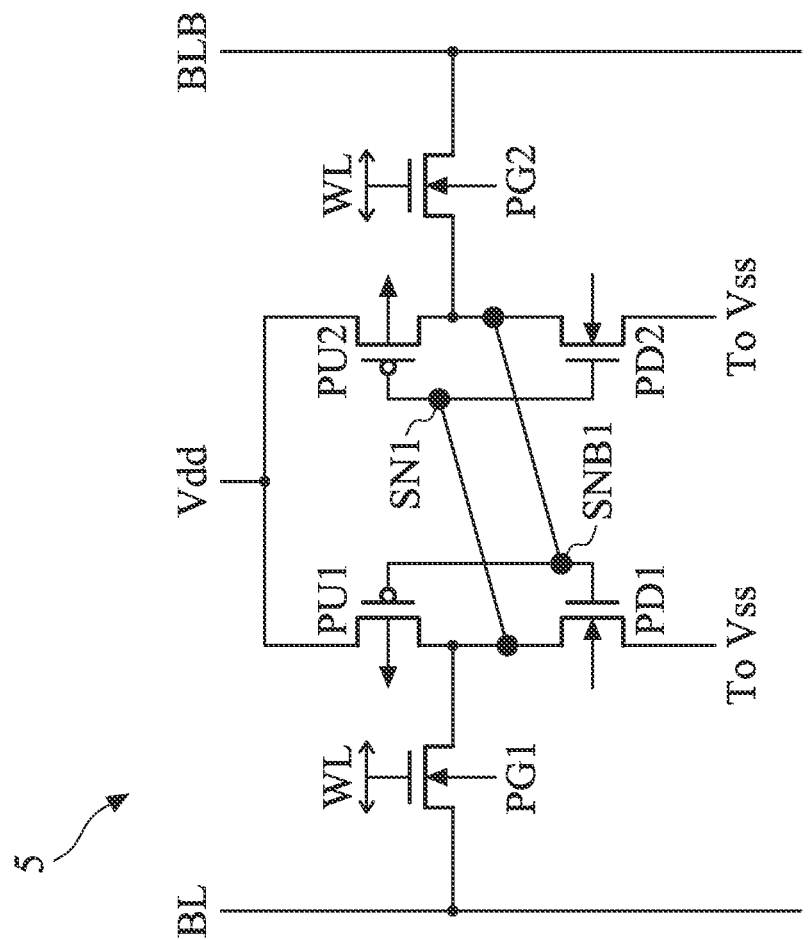
FIG. 1 is a circuit diagram of an SRAM according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a static random access memory (SRAM) device. An SRAM device is a type of semiconductor memory that uses bi-stable latching circuitry (e.g., flip-flop) to store binary bits of information. FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vdd (also referred to as Vcc), and the sources of the pull-down transistors PD1 and PD2 are coupled to a voltage Vss, which may be an electrical ground in some embodiments.

The first storage node SN1 of the first data latch is coupled to bit line (BL) through pass-gate transistor PG1, and the complementary first storage node SNB1 is coupled to complementary bit line (also referred to as bit line bar, or BLB) through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL.

According to the various aspects of the present disclosure, SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects (e.g., SRAM cells or voltage control circuits) of the following disclosure may be implemented using FinFET devices, but it is understood that the application is not limited to FinFET devices, except as specifically claimed. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety.

Figure 2:
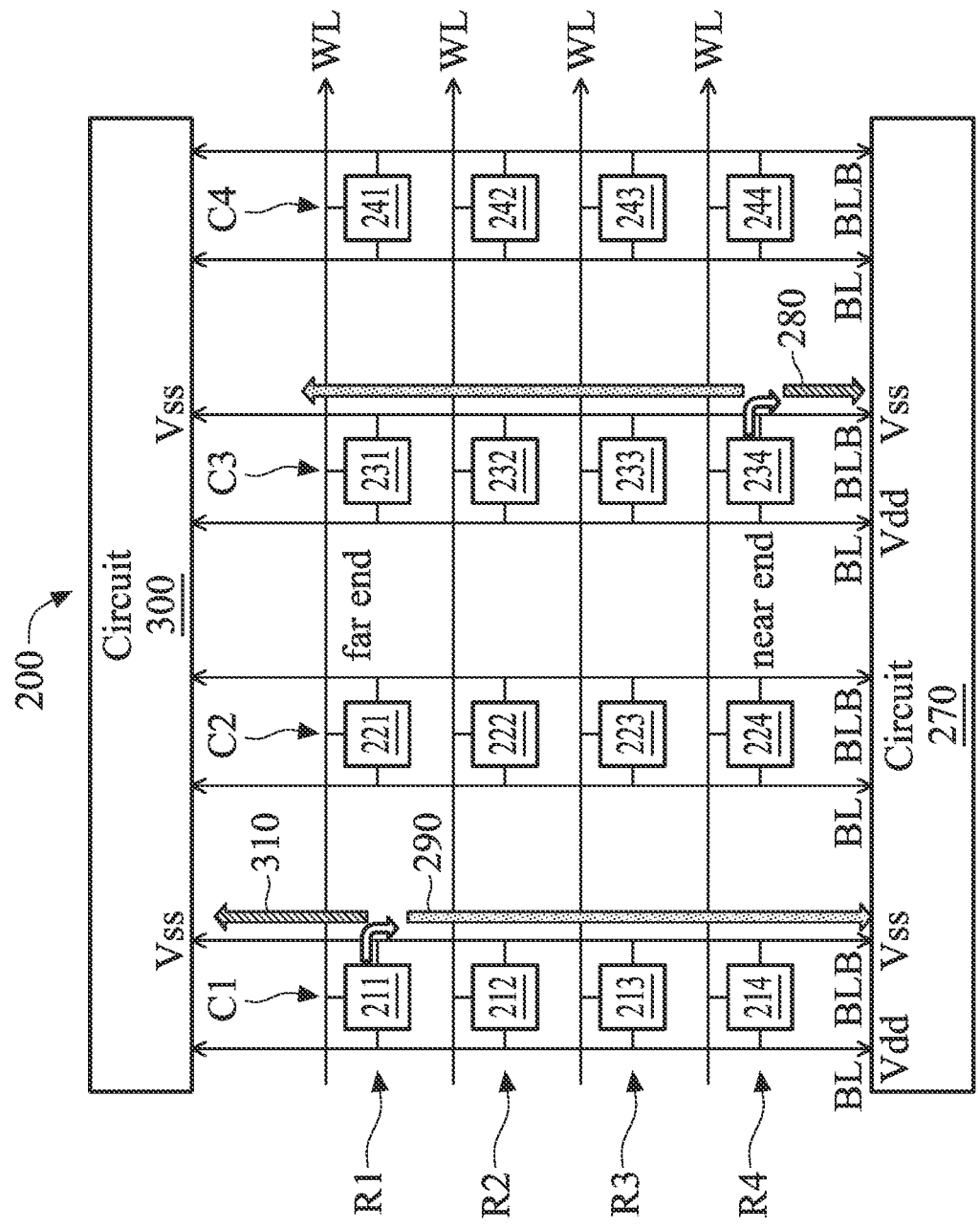
FIG. 2 is a simplified circuit diagram of an SRAM device according to various aspects of the present disclosure.

FIG. 2 is a simplified circuit diagram of an SRAM device 200 according to various aspects of the present disclosure. As a simplified and non-limiting example, the SRAM device 200 includes a 4-by-4 cell array made up of four rows (denoted as R1-R4 herein) and four columns (denoted as C1-C4 herein) of SRAM cells 211-214, 221-224, 231-234, and 241-244. Each of the SRAM cells may be implemented as an embodiment of the SRAM cell 5 of FIG. 1. Each of the SRAM cells is electrically coupled to a respective word line (WL) signal line, for example through the pass-gates (e.g., PG1 and PG2) of each of the SRAM cells. Each of the SRAM cells is also electrically coupled to a respective bit line (BL) signal line and a respective bit line bar (BLB) signal line. The BLB signal line is a logical complement of the BL signal line. For example, when the BL signal line is at a logic high, the BLB signal line is at a logic low, and vice versa. The WL signal line extend "horizontally" in the top view of FIG. 2, and the BL and BLB signal lines each extend "vertically" in the top view of FIG. 2. The WL, BL, and BLB signal lines may each be implemented using one or more metal layers of an interconnect structure. In some embodiments, the BL and BLB signal lines may be formed in a different metal layer than the WL signal line. Of course, it is also envisioned that even the BL and BLB signal lines may be formed in different metal layers, or that different WL signal lines may also be formed in different metal layers.

The BL and BLB signal lines of the SRAM device 200 are routed to (or electrically coupled to) a circuit 270. In some embodiments, the circuit 270 is located externally to the SRAM device 200. The circuit 270 may include a plurality of different types of circuits, for example the "write" driver circuits for the SRAM device 200, sense amplifier circuits, row/column decoders, shifter registers, address generators, and circuits that produce various control signals. Among other things, the circuit 270 sets the BL signal line either to Vdd (e.g., a logic high) or Vss (e.g., ground, or logic low), and sets the BLB signal line to either Vss or Vdd.

The BL and BLB signal lines may be implemented using metal lines in a multilayer interconnect structure. As the device scaling process continues, parasitic resistance of the metal lines may adversely impact device performance. In more detail, parasitic resistance of a metal line varies based on the length of the metal line. As the length of the metal line increases, so does its parasitic resistance. Also according to Ohm's law ($V=I*R$), voltage varies as a function of resistance. In the case of an SRAM array such as the SRAM device 200 shown in FIG. 2, the SRAM cells in each column C1-C4 will not experience the same voltage on their BL and BLB signal lines.

For example, for the column C3 of SRAM cells, the SRAM cell 234 is located the closest to the circuit 270 (i.e., at a "near end" of BL and BLB), where Vdd and Vss signals are generated. As such, Vdd and Vss signals only need to travel a small distance across the metal lines of BL and BLB in order to reach the SRAM cell 234. Consequently, the parasitic resistance contributed by the metal lines of BL and BLB is small for the SRAM cell 234, which leads to a small voltage loss in the Vdd and Vss signals for the SRAM cell 234. Alternatively stated, the SRAM cell 234 has a relatively low-resistance path 280 to Vss. Since the locations of the SRAM cells 224, 234, and 244 are similar to the SRAM cell 214, and thus the SRAM cells 224, 234, and 244 may each experience a relatively small voltage loss similar to SRAM cell 214, or may be said to each have a low-resistance path to Vss.

On the other hand, for the column C1 of the SRAM cells, the SRAM cell 211 is located the farthest to the circuit 270 (i.e., at a "far end" of the BL and BLB), and thus the Vdd and Vss signals need to travel a relatively long distance across the metal lines of BL and BLB before reaching the SRAM cell 211. Consequently, the parasitic resistance attributed by the metal lines of BL and BLB is much bigger, which leads to a bigger voltage loss in the Vdd and Vss signals for the SRAM cell 211. Alternatively stated, the SRAM cell 211 would have had a relatively high-resistance path 290 to Vss (if the solution of present disclosure had not been implemented). Since the locations of the SRAM cells 221, 231, and 241 are similar to the SRAM cell 211, and thus the SRAM cells 221, 231, and 241 may each experience a relatively big voltage loss similar to SRAM cell 211, or may be said to each have a high-resistance path to Vss.

This problem caused by parasitic resistance is exacerbated when the columns C1-C4 are much longer, for example when they can each contain 128 or 256 SRAM cells. In those scenarios, the voltage loss at the "far end" of the columns may be substantial enough to severely degrade the signals Vdd and Vss. In the case of Vdd, the impact may not be as damaging to the operation of the SRAM device 200, since the transistors of the SRAM device 200 would be operating in a saturation state, where the degradation in the Vdd signal is not as likely to affect the intended operation or performance of the SRAM device 200. However, in the case of Vss, the transistors of the SRAM would not be operation in the saturation state, and the degradation in the Vss signal could substantially affect the operation or performance of the SRAM device 200. For example, the voltage drop caused by parasitic resistance may degrade certain SRAM operating parameters or criteria, such as a minimum operating voltage (hereinafter referred to as Vmin or Vcc_min). In some cases, the degradation of the Vmin may be as high as a few hundred milli-volts (mV), particularly for SRAM cells at the "far end" of the column. If Vmin is not satisfied, a SRAM cell may experience degradations in speed and/or write margins, or read/write failures, access failures, and/or retention failures.

To overcome the problems caused by voltage drop due to parasitic resistance, the present disclosure implements a circuit 300. The circuit 300 may be implemented within the SRAM device 200 and is electrically coupled to the BL and BLB signal lines. The circuit 300 provides another low-resistance path for the BL and BLB signal lines when the Vss is applied to the "far end" SRAM cells. For example, the SRAM cell 211 now has a low-resistance path 310 to Vss, and similarly the SRAM cells 221, 231, and 241 also each have a low-resistance path to Vss. In this manner, the SRAM cells located in the "far end" no longer suffer from the voltage degradation (e.g., Vmin) caused by excessive parasitic resistance due to the length of the metal lines, and as such device performance may be substantially improved. In addition, the alternative path to Vss provided by the circuit 300 may reduce the electrical current on the BL and BLB signal lines (for example by a factor of 2). Since the voltage degradation caused by parasitic resistance is directly correlated with the electrical current (V=I*R), this helps to further reduce the voltage degradation caused by parasitic resistance. Furthermore, it is understood that although the voltage degradation improvement may be the most pronounced for the SRAM cells located at the "far end", the rest of the SRAM cells in the SRAM array may benefit from having such an alternative path to Vss as well. For example, assuming that BL or BLB is implemented a metal line with a substantially uniform material and thickness/width, the then for about half of the SRAM cells in any given column C1-C4, the lowest resistance path to Vss is the path down to the Vss provided by the circuit 270. Meanwhile, for the other half of the SRAM cells in that column, the lowest resistance path to Vss is the path up to the Vss provided by the circuit 300.

It is understood that a copy of the circuit 300 is implemented for each of the columns C1-C4. For example, since the SRAM device 200 has four columns C1-C4 herein, then four copies of the circuit 300 are implemented for the SRAM device 200, one for each column. If the SRAM device 200 had X number of columns, then X number of copies of the circuit 300 may be implemented for the SRAM device 200. For reasons of simplicity, however, the circuits for all the columns C1-C4 are hereinafter collectively referred to as the circuit 300.

Figure 3:
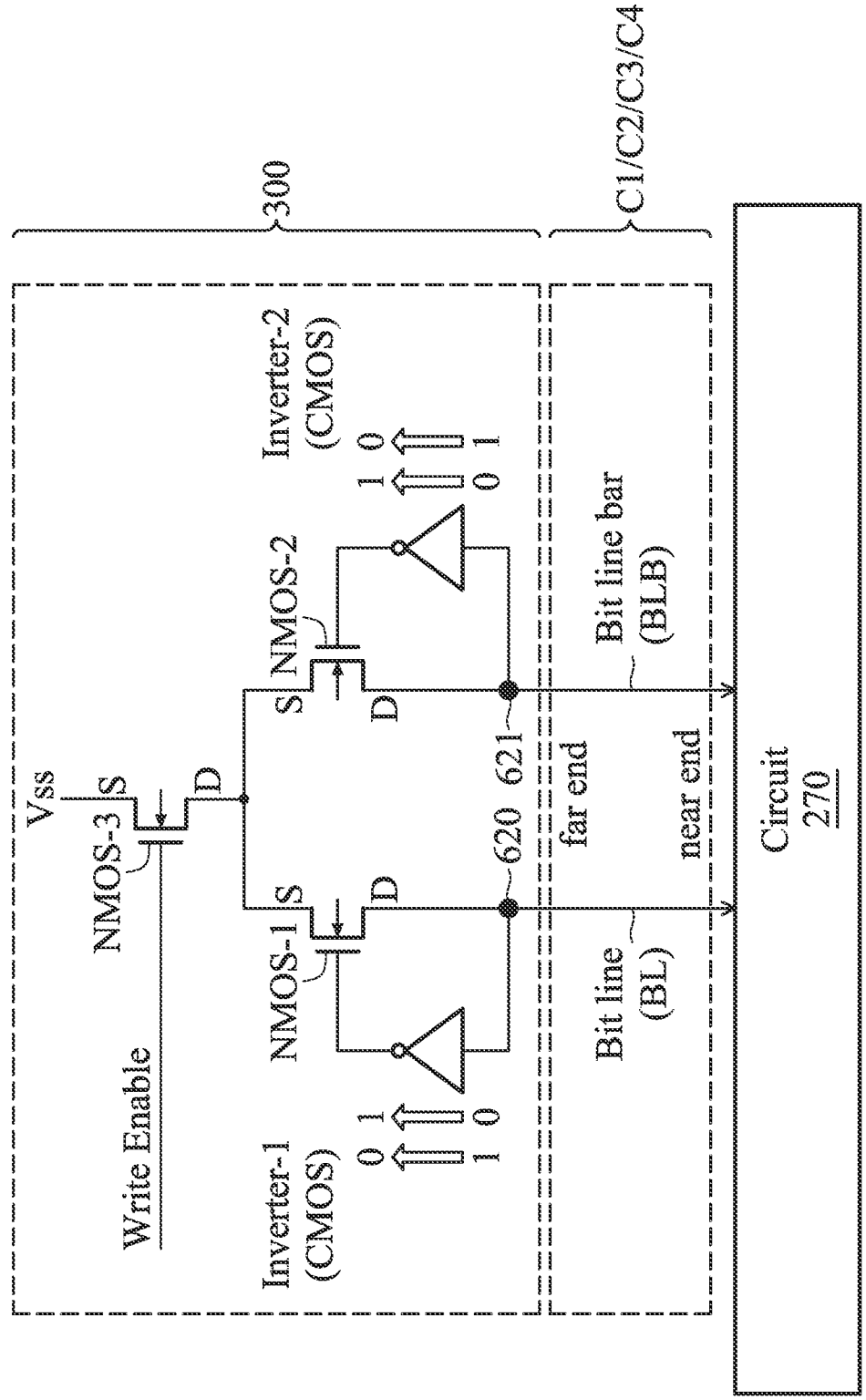
FIGS. 3-5 are circuit schematics of a circuit inside an SRAM device according to various aspects of the present disclosure.

FIG. 3 is a circuit diagram of the circuit 300 according to a first embodiment of the present disclosure. In this embodiment, the circuit 300 includes an inverter-1 and an inverter-2. The inverter-1 and inverter-2 are each configured to receive a logic high signal (i.e., a logic 1) and output a logic low signal (i.e., a logic 0), or to receive a logic low signal and output a logic high signal. In some embodiments, the inverter-1 and inverter-2 are implemented using CMOS (complementary metal oxide semiconductor).

The circuit 300 further includes a transistor NMOS-1, a transistor NMOS-2, and a transistor NMOS-3, which may function as pass gates herein. The drain of the transistor NMOS-1 and the input of the inverter-1 are both electrically tied to the "far end" of the BL signal line. The drain of the transistor NMOS-2 and the input of the inverter-2 are both electrically tied to the "far end" of the BLB signal line. The "near end" of BL and BLB are electrically coupled to the circuit 270, as discussed above with reference to FIG. 2.

The gate of the transistor NMOS-1 is electrically tied to the output of the inverter-1. The gate of the transistor NMOS-2 is electrically tied to the output of the inverter-2. The source of the transistor NMOS-1 and the source of the transistor NMOS-2 are each electrically tied to the drain of the transistor NMOS-3. The source of the transistor NMOS-3 is electrically tied to the signal Vss, and the gate of the transistor NMOS-3 is electrically tied to a control signal "write enable", which may be generated by the circuit 270 of FIG. 2, for example.

The electrical operation of the first embodiment of the circuit 300 is now described in more detail with reference to Truth table 1 below. The cells under the "input" of bit-line and bit-line bar in Truth table 1 correspond to the values of BL and BLB signals at the "near end" (i.e., received from the circuit 270), and the cells under the "output" of bit-line and bit-line bar in Truth table 1 correspond to the values of BL and BLB signals at the "far end" (i.e., received as a result of the circuit 300 being turned on).

Truth table 1

| | SRAM operation | | | | |
|---|---|---|---|---|---|
| | Input | | | output | |
| | Bit-line | Bit-line bar | write enable | Bit-line | Bit-line bar |
| Signal state | 1 | 0 | 1 | 1 (or floating) | 0 (to Vss) |
| | 0 | 1 | 1 | 0 (to Vss) | 1 (or floating) |
| | 1 | 1 | 0 | 1 (or floating) | 1 (or floating) |
| | 0 | 0 | 0 | 0 (or floating) | 0 (or floating) |
| | 1 | 0 | 0 | 1 (or floating) | 0 (or floating) |
| | 0 | 1 | 0 | 0 (or floating) | 1 (or floating) |

During a write cycle, the write enable signal is charged to a logic 1 (e.g., Vdd). This turns on the transistor NMOS-3, which will let the Vss signal pass from the source to the drain, and this the drain of NMOS-3 is now at Vss. When a data value of 1 needs to be written to the data node, BL is set to 1 (e.g., Vdd), and BLB is set to 0 (e.g., Vss). Since BL is set to 1, the inverter-1 receives 1 as an input and returns 0 as an output, which means a logic low is at the gate of NMOS-1. Consequently, NMOS-1 is turned off, since it needs a logic high signal at its gate to be turned on. As a result, BL is cut off from Vss, and it may be said that the far end of BL is at a logic 1 or is electrically floating. On the other hand, since BLB is set to 0, the inverter-2 receives 0 as an input and returns 1 as an output, which means a logic high is at the gate of NMOS-2. Consequently, NMOS-2 is turned on, and it allows Vss to be passed from the source to the drain of NMOS-2. In this manner, the far end of BLB receives Vss at a much shorter path than before—it receives Vss through two pass gates NMOS-3 and NMOS-2, rather than having to go through the entire length of the metal line from the far end to the near end (i.e., through the entirety of the column of SRAM cells) to receive Vss from the circuit 270.

When a data value of 0 needs to be written to the data node, BL is set to 0 (e.g., Vss), and BLB is set to 1 (e.g., Vdd). Since BL is set to 0, the inverter-1 receives 0 as an input and returns 1 as an output, which means a logic high is at the gate of NMOS-1. Consequently, NMOS-1 is turned on, and it allows Vss to be passed from the source to the drain of NMOS-1. In this manner, the far end of BL receives Vss at a much shorter path than before—it receives Vss through two pass gates NMOS-3 and NMOS-1, rather than having to go through the entire length of the metal line from the far end to the near end (i.e., through the entirety of the column of SRAM cells) to receive Vss from the circuit 270. On the other hand, since BLB is set to 1, the inverter-2 receives 1 as an input and returns 0 as an output, which means a logic low is at the gate of NMOS-2. Consequently, NMOS-2 is turned off, and BLB is cut off from Vss, and it may be said that the far end of BLB is at a logic 1 or is electrically floating.

The operations described above correspond to the two rows of Truth table 1 when "write enable" is set to 1.

During a read cycle, the write enable signal is charged to a logic 0 (e.g., Vss). The low signal at the gate of NMOS-3 means that NMOS-3 is turned off, and Vss is not passed from the source to the drain of NMOS-3. In other words, since NMOS-3 is turned off, the circuit 300 does not affect the operation of the SRAM device 200. The far end of BL and BLB signal lines may be kept electrically floating. The read cycle operations correspond to the four rows of Truth table 1 when "write enable" is set to 0.

Figure 4:
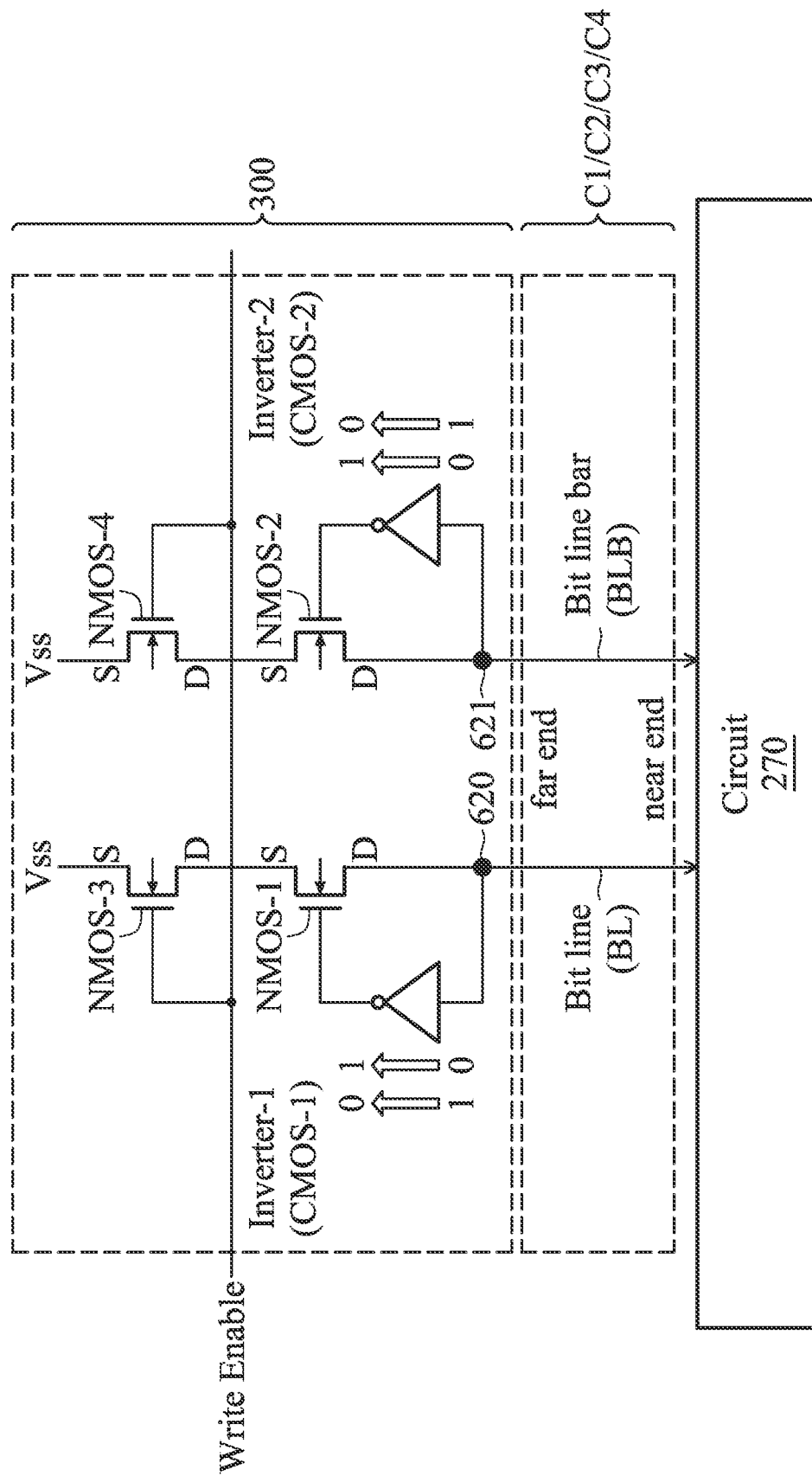

FIG. 4 is a circuit diagram of the circuit 300 according to a second embodiment of the present disclosure. The second embodiment of the circuit 300 shares many similarities with the first embodiment discussed above with reference to FIG. 3. For reasons of consistency and clarity, the similar components are labeled the same in both FIG. 3 and FIG. 4, and the discussions of the similar operations are not repeated herein.

One difference between the first embodiment and the second embodiment of the circuit 300 is that an extra transistor NMOS-4 is implemented in the second embodiment of the circuit 300. In more detail, the source of the transistor NMOS-4 is electrically tied to the signal Vss, the gate of the transistor NMOS-4 is electrically tied to the control signal "write enable", and the drain of the transistor NMOS-4 is electrically tied to the source of the transistor NMOS-2. The source of the transistor NMOS-1 is electrically tied to the drain of the transistor NMOS-3, but not to the drain of the transistor NMOS-4 or the source of the transistor NMOS-2.

The electrical operation of the second embodiment of the circuit 300 is now described in more detail with reference to Truth table 2 below.

Truth table 2

| | SRAM operation | | | | |
|---|---|---|---|---|---|
| | Input | | | output | |
| | Bit-line | Bit-line bar | write enable | Bit-line | Bit-line bar |
| Signal state | 1 | 0 | 1 | 1 (or floating) | 0 (to Vss) |
| | 0 | 1 | 1 | 0 (to Vss) | 1 (or floating) |
| | 1 | 1 | 0 | 1 (or floating) | 1 (or floating) |
| | 0 | 0 | 0 | 0 (or floating) | 0 (or floating) |
| | 1 | 0 | 0 | 1 (or floating) | 0 (or floating) |
| | 0 | 1 | 0 | 0 (or floating) | 1 (or floating) |

The electrical operation of the second embodiment of the circuit 300 is also substantially similar to the first embodiment, although two pass gates (i.e., NMOS-3 and NMOS-4) are now being used to pass the Vss signal down to the far end of the BL or BLB signal lines when appropriate. In comparison, the first embodiment uses just one pass gate (i.e., NMOS-3) to pass the Vss signal down to the far end of the BL or BLB signal lines. The implementation of the extra pass gate NMOS-4 in the second embodiment provides more symmetry in the layout of the circuit 300, since NMOS-4 is symmetrical to NMOS-3. The enhanced layout symmetry may translate into improved device fabrication and/or performance.

Figure 5:
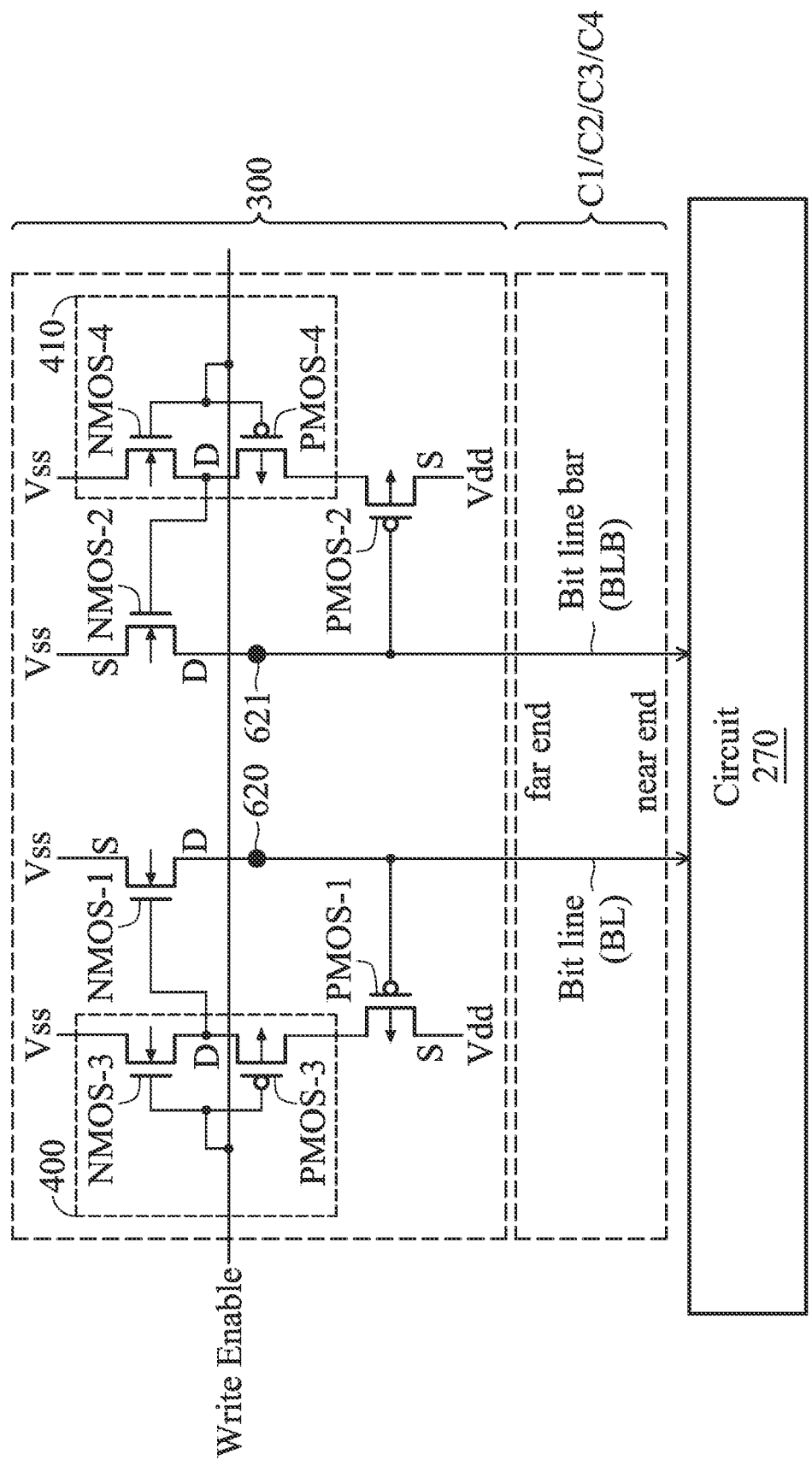

FIG. 5 is a circuit diagram of the circuit 300 according to a third embodiment of the present disclosure. In this third embodiment, the circuit 300 includes four PMOS transistors PMOS-1, PMOS-2, PMOS-3, and PMOS-4, as well as four NMOS transistors NMOS-1, NMOS-2, NMOS3, and NMOS-4. The gates of PMOS-1 and PMOS-2, as well as the drains of NMOS-1 and NMOS-2, are electrically tied to the "far end" of the BL signal line and the "far end" of the BLB signal line, respectively. The sources of PMOS-1 and PMOS-2 are each electrically tied to Vdd, and the drains of PMOS-1 and PMOS-2 are electrically tied to the sources of PMOS-3 and PMOS-4, respectively.

The control signal "write enable" is electrically tied to the gates of PMOS-3, PMOS-4, NMOS-3, and NMOS-4. The drains of PMOS-3 and PMOS-4 are electrically tied to the drains of NMOS-3 and NMOS-4, respectively. The sources of NMOS-1, NMOS-2, NMOS-3, and NMOS-4 are each electrically tied to Vss. The drains of PMOS-3 and PMOS-4 are electrically tied to the gates of NMOS-1 and NMOS-2, respectively.

The electrical operation of the third embodiment of the circuit 300 is now described in more detail with reference to Truth table 3 below. Similar to the Truth table 1 discussed above, the cells under the "input" of bit-line and bit-line bar in Truth table 3 correspond to the values of BL and BLB signals at the "near end" (i.e., received from the circuit 270), and the cells under the "output" of bit-line and bit-line bar in Truth table 3 correspond to the values of BL and BLB signals at the "far end" (i.e., received as a result of the circuit 300 being turned on).

Truth table 3

| | | SRAM operation | | |
|---|---|---|---|---|
| | Input signal | | output | |
| | Bit-line | Bit-line bar | write enable | Bit-line | Bit-line bar |
| Signal state | 1 | 0 | 0 | 1 (or floating) | 0 (to Vss) |
| | 0 | 1 | 0 | 0 (to Vss) | 1 (or floating) |
| | 1 | 1 | 1 | 1 (or floating) | 1 (or floating) |
| | 0 | 0 | 1 | 0 (or floating) | 0 (or floating) |
| | 1 | 0 | 1 | 1 (or floating) | 0 (or floating) |
| | 0 | 1 | 1 | 0 (or floating) | 1 (or floating) |

During a write cycle, the write enable signal is set to a logic 0 (e.g., Vss). This turns off NMOS-3 and NMOS-4 but turns on PMOS-3 and PMOS-4.

Note that NMOS-3 and PMOS-3 are coupled in a manner to serve as an inverter 410, so long as PMOS-1 is turned on as a pass gate to let the source of PMOS-3 receive Vdd (from the source of PMOS-1). In such a scenario, the electrically-tied gates of NMOS-3 and PMOS-3 serve as the input of the inverter 410 to receive the control signal "write enable", and the electrically-tied drains of NMOS-3 and PMOS-3 serve as the output of the inverter 410. Similarly, NMOS-4 and PMOS-4 are coupled in a manner to serve as an inverter 420, so long as PMOS-2 is turned on as a pass gate to let the source of PMOS-4 receive Vdd (from the source of PMOS-2). In such a scenario, the electrically-tied gates of NMOS-4 and PMOS-4 serve as the input of the inverter 420 to receive the control signal "write enable", and the electrically-tied drains of NMOS-4 and PMOS-4 serve as the output of the inverter 420.

When a data value of 1 needs to be written to the data node, BL is set to a logic 1 (e.g., Vdd), and BLB is set to a logic 0 (e.g., Vss). This turns off PMOS-1 and turns on PMOS-2. Since PMOS-1 is turned off, the inverter 400 is not turned on, and thus NMOS-1 is not turned on either. As such, the BL signal line is at logic 1 or floating. However, the turning on of PMOS-2 allows the inverter 410 to be turned on. Since the control signal "write enable" is set to a logic 0, the inverter 410 returns a logic 1 as its output. The output of the inverter 410 is tied to the gate of NMOS-2, and thus NMOS-2 is turned on by the logic high signal at its gate. Since NMOS-2 is turned on, it allows Vss to be passed from its source to its drain, which is then received by the "far end" of the BLB signal line.

When a data value of 0 needs to be written to the data node, BL is set to a logic 0 (e.g., Vss), and BLB is set to a logic 1 (e.g., Vdd). This turns off PMOS-2 and turns on PMOS-1. Since PMOS-2 is turned off, the inverter 410 is not turned on, and thus NMOS-2 is not turned on either. As such, the BLB signal line is at logic 1 or floating. However, the turning on of PMOS-1 allows the inverter 400 to be turned on. Since the control signal "write enable" is set to a logic 0, the inverter 400 returns a logic 1 as its output. The output of the inverter 400 is tied to the gate of NMOS-1, and thus NMOS-1 is turned on by the logic high signal at its gate. Since NMOS-1 is turned on, it allows Vss to be passed from its source to its drain, which is then received by the "far end" of the BL signal line.

The operations described above correspond to the two rows of Truth table 3 when "write enable" is set to 0.

During a read cycle, the write enable signal is charged to a logic 1 (e.g., Vdd). The logic 1 signal is inverted into a logic low signal by the inverters 400 and 410, which means that a logic low signal is at the gates of NMOS-1 and NMOS-2. As such, NMOS-1 and NMOS-2 are turned off, and Vss is not passed from the source to the drain of NMOS-1 or NMOS-2. In other words, since NMOS-1 and NMOS-2 are both turned off, the circuit 300 does not affect the operation of the SRAM device 200. The read cycle operations correspond to the four rows of Truth table 3 when "write enable" is set to 1.

It is understood that FIGS. 3-5 merely illustrate example embodiments for the circuit 300. Other embodiments are also envisioned, as long as they are configured to provide a low-resistance path to Vss for BL or BLB when appropriate.

Figure 6:
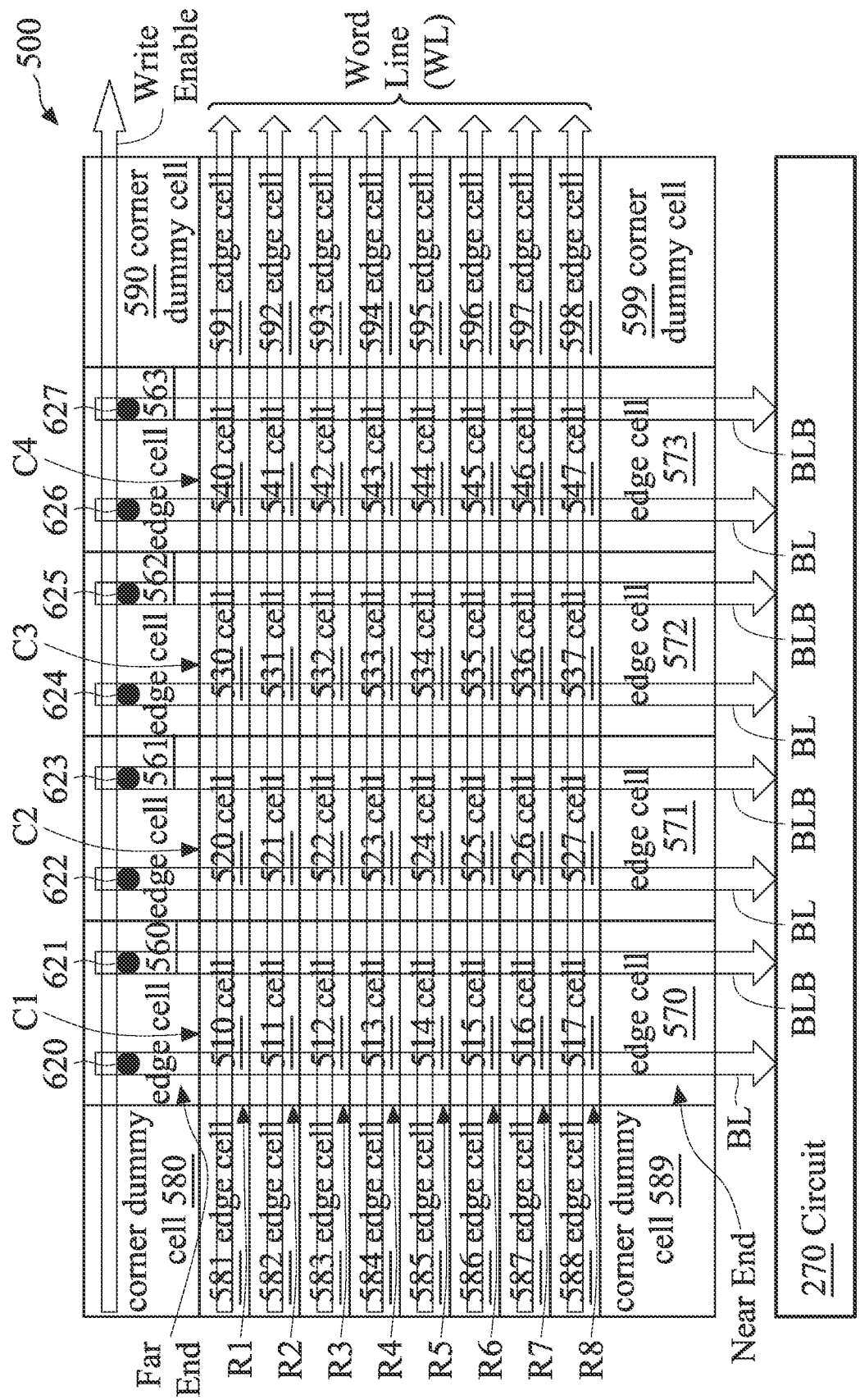
FIG. 6 illustrates a simplified diagrammatic top view of a layout of a SRAM device according to various aspects of the present disclosure.
Figure 8:
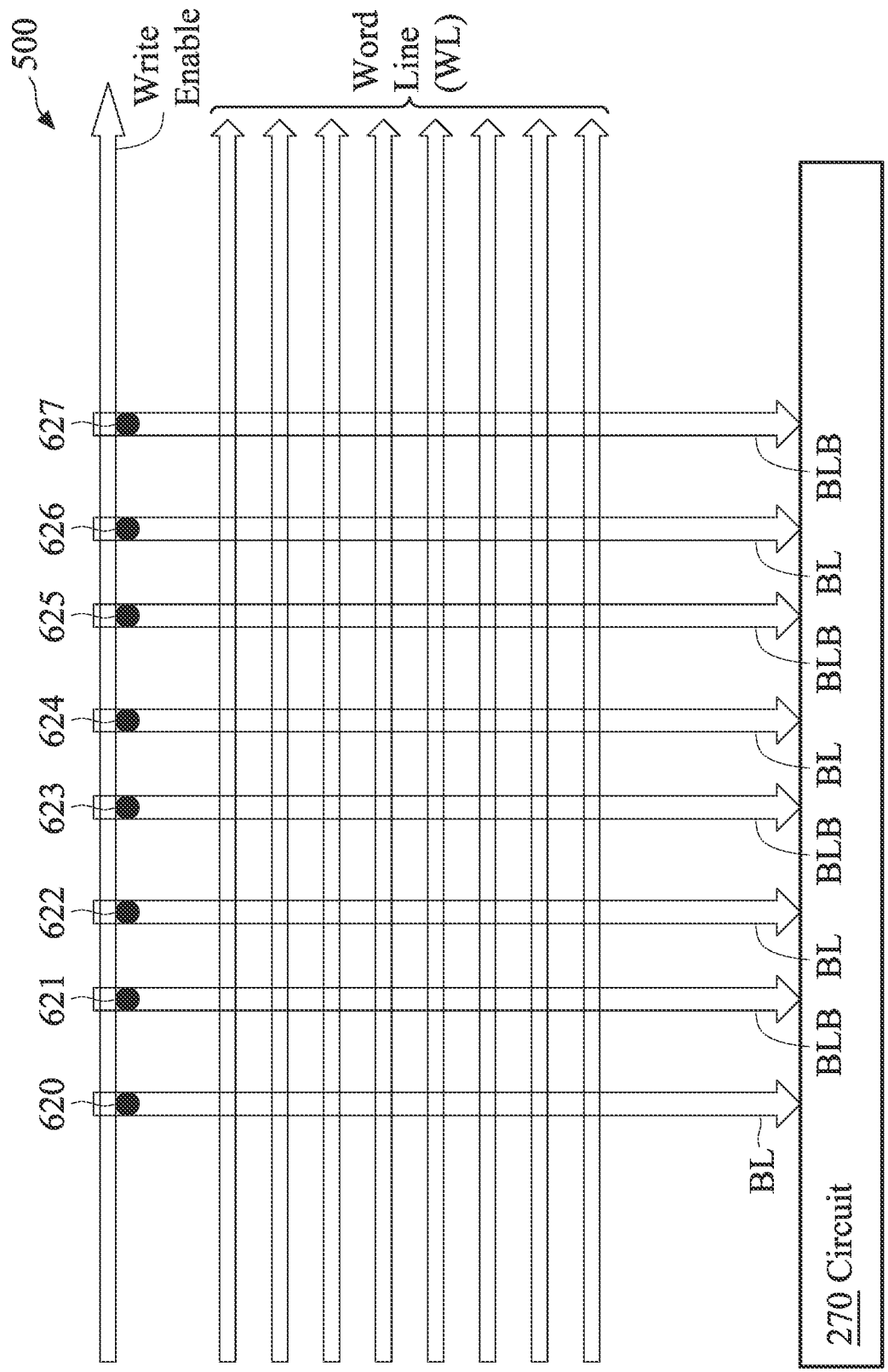
FIG. 8 illustrates various signal lines or control signals shown in FIG. 6 according to various aspects of the present disclosure.

FIG. 6 illustrates a simplified diagrammatic top view of a layout of a SRAM device 500. For ease of illustration and simplicity, the content of FIG. 6 is also broken down to the content shown in FIG. 7 and FIG. 8. In that regard, FIG. 7 illustrates the top view layout of the SRAM cells and edge cells of the SRAM device 500, and FIG. 8 illustrates the various signal lines or control signals generated by, or fed into, the circuit 270 discussed above with reference to FIG. 2. In other words, FIG. 6 is a superimposed view of FIGS. 7 and 8.

Referring to FIGS. 6-8, the SRAM device 500 is similar in many respects to the SRAM device 200 discussed above. For example, the SRAM device 500 includes an array of SRAM cells that are electrically coupled to signal lines such as word line (WL), bit line (BL), bit line bar (BL), or write enable. These signal lines are generated by, or fed into, the circuit 270. The SRAM device 500 also has a plurality of the circuits 300 implemented therein, such as the first, second, or third embodiment of the circuit 300 illustrated in FIGS. 3-5 and discussed above. The circuits 300 are not specifically illustrated in FIGS. 6-8, but it is understood that they are implemented in some of the edge cells of the SRAM device 500, as discussed in more detail below.

One difference between the SRAM device 200 and the SRAM device 500 is that the SRAM device 500 includes a bigger array of SRAM cells. For example, whereas the SRAM device 200 includes a 4-by-4 SRAM cell array, the SRAM device 500 includes an 4-by-8 SRAM cell array comprised of four columns C1-C4 and eight rows R1-R8. The C1 column includes SRAM cells 510-517, the C2 column includes SRAM cells 520-527, the C3 column includes SRAM cells 530-537, and the C4 column includes SRAM cells 540-547. Each of the SRAM cells herein may be implemented as an embodiment of the SRAM cell 5 of FIG. 1. And similar to the SRAM device 200 of FIG. 2, each of the SRAM cells of the SRAM device 500 is electrically coupled to their respective WL, BL, and BLB signal lines.

The SRAM device 500 further includes a plurality of edge cells disposed around the 4-by-8 SRAM cell array. For example, in the top view shown in FIGS. 6-7, the edge cells 560-563 are disposed "above" the SRAM cell array, the edge cells 570-573 are disposed "below" the SRAM cell array on the opposite side, the edge cells 580-589 are disposed to the "left" of the SRAM cell array, and the edge cells 590-599 are disposed to the "right" of the SRAM cell array on the opposite side.

The edge cells 560-563 are located at the "far end" of the BL and BLB signal lines (or overlap with the "far end" of the BL and BLB signal lines in the top view). As such, parasitic resistance may have a substantial impact on Vss voltages of the BL and BLB signal lines. To overcome this problem, according to embodiments of the present disclosure, a copy of the circuit 300 discussed above (which could be the first embodiment shown in FIG. 3, the second embodiment shown in FIG. 4, or the third embodiment shown in FIG. 5, or some other suitable embodiment) is implemented in each of the edge cells 560-563. In this manner, a first copy of the circuit 300 can help reduce the Vss degradation caused by parasitic resistance for the SRAM cells 510-517 in column C1, a second copy of the circuit 300 can help reduce the Vss degradation caused by parasitic resistance for the SRAM cells 520-527 in column C2, a third copy of the circuit 300 can help reduce the Vss degradation caused by parasitic resistance for the SRAM cells 530-537 in column C3, and a fourth copy of the circuit 300 can help reduce the Vss degradation caused by parasitic resistance for the SRAM cells 540-547 in column C4. As discussed above, the reduction in Vss degradation is not just for the SRAM cells located at the "far end", though the reduction is the most apparent for these cells). Rather, about half of the SRAM cells (e.g., SRAM cells 510-513, 520-523, 530-533, and 540-543) may experience a reduction in Vss degradation due to having an alternative low-resistance path to Vss. Furthermore, the electrical current on BL or BLB may be reduced (e.g., roughly halved) due to having the alternative path to Vss as well. The reduction in current translates into a reduction in voltage degradation (since V=I*R), which offers an improvement in voltage degradation for all SRAM cells.

With reference to FIGS. 6 and 8, a plurality of connection points 620-627 are implemented in the edge cells 560-563. The connections points 620-627 may be implemented using conductive vias and/or metal lines in an interconnect structure, and they are configured to electrically connect the BL and BLB signals to the circuit 300 in each of the edge cells 560-563. For example, the connection point 620 is configured to electrically connect the BL signal line in the column C1 to the circuit 300 in the edge cell 560, and the connection point 621 is configured to electrically connect the BLB signal line in the column C1 to the circuit 300 in the edge cell 560. See also FIGS. 3-5 for the example locations of the connection points 620-621.

Depending on the implementation of the circuit 300, the connection points 620-621 may be configured to different nodes of the circuit 300. For example, in the first and second embodiments of the circuit 300 shown in FIGS. 3-4, the connection point 620 electrically couples the drain of NMOS-1 and the input of inverter-1 to the BL signal line, and the connection point 621 electrically couples the drain of NMOS-2 and the input of inverter-2 to the BLB signal line. In the third embodiment of the circuit 300 shown in FIG. 5, the connection point 620 electrically couples the drain of NMOS-1 and the gate of PMOS-1 to the BL signal line, and the connection point 621 electrically couples the drain of NMOS-2 and the gate of PMOS-2 to the BLB signal line.

Furthermore, the edge cells 560-563 may have one or more well-strap modules implemented therein. Well-strap modules may include strapping cells to produce an array having consistent operating characteristics. For example, the strapping cells may provide an insulating structure between multiple rows of an SRAM memory array, which helps to create a more uniform operation of the memory cells regardless of the positions of the memory cells within the memory array. Well-strap modules are described in more detail in U.S. Pat. No. 10,157,987, entitled "Fin-based Strap Cell Structure", U.S. Pat. No. 7,812,407, entitled "Memory Array Structure With Strapping Cells", and U.S. Pat. No. 7,675,124, entitled "Memory Array Structure With Strapping Cells" the disclosures of each of which are hereby incorporated by reference in their entireties.

The edge cells 570-573 are located at the "near end" of the BL and BLB signal lines (or overlap with the "near end" of the BL and BLB signal lines in the top view). Since the BL and BLB signal lines at the "near end" can receive Vdd or Vss more directly due to the short metal line length, parasitic resistance may not have a substantial impact on Vss voltages of the BL and BLB signal lines at the "near end". Therefore, the circuit 300 is not necessary for the edge cells 570-573. The edge cells 570-573 may have one or more bit line connection modules implemented therein, which may include vias and/or metal lines of an interconnect structure to provide electrical connectivity to BL and BLB signal lines (and/or other signal lines). Bit line connection modules are described in more detail in U.S. Pat. No. 9,583,438, entitled "Interconnect Structure With Misaligned Metal Lines Coupled Using Different Interconnect Layer" and U.S. Pat. No. 9,865,542, entitled "Interconnect Structure With Misaligned Metal Lines Coupled Using Different Interconnect Layer", the disclosures of each of which are hereby incorporated by reference in their entireties. In some embodiments, the edge cells 570-573 may also have the well strap modules implemented therein.

The edge cells 580-589 and 590-599 (including the corner dummy cells 580, 590, 589, and 599) may be configured to include various dummy structures, such as dummy active regions, dummy gate structures, etc. These dummy structures help facilitate a more uniform topography distribution throughout the SRAM device 500. In other words, if the SRAM device 500 had been implemented to include functional structures or patterns in the SRAM cells 510-547 but leave the edge cells 580-599 empty, there would have been substantial topography variations and/or pattern density variations throughout the wafer on which the SRAM device 500 is fabricated. These topography and/or pattern density variations could degrade lithography performance, which in turn worsens the device performance. Thus, by implementing dummy structures in the edge cells, lithography and device performance may be improved. In some embodiments, the edge cells may also be utilized for electrical routing. For example, vias and/or metal lines of an interconnect structure may be implemented in the edge cells 580-599 to provide electrical connectivity to the various functional components of the SRAM device 500.

The following table provides a quick summary of the functionality of the circuit 300, also referred to as a "voltage control circuit" herein. During a write cycle, the "write enable" signal is turned "on" (i.e., set to Vdd). The BL signal may be either high (Vdd) or low (Vss), and its complementary signal BLB may be low or high. The voltage control circuit (i.e., the circuit 300) is at least partially turned on during the write cycle. When BL is supposed to be low and BLB is supposed to be high, the portion of the voltage control circuit that is turned on (e.g., NMOS-1 and NMOS-3 in FIG. 3) helps electrically connect the "far end" of BL to Vss, and the portion of the voltage control circuit that is turned off (e.g., NMOS-2) keeps the "far end" of BLB electrically floating at Vdd. When BL is supposed to be high and BLB is supposed to be low, the portion of the voltage control circuit that is turned on (e.g., NMOS-2 and NMOS-3 in FIG. 3) helps electrically connect the "far end" of BLB to Vss, and the portion of the voltage control circuit that is turned off (e.g., NMOS-1) keeps the "far end" of BL electrically floating at Vdd. During a read cycle, the "write enable" signal is turned "off" (i.e., set to Vss). The BL and BLB signals are each set to high, and the voltage control circuit is turned off.

| Voltage control circuit functionality | | | | |
|---|---|---|---|---|
| | SRAM operation | | | |
| | Write cycle | | Read cycle | |
| | Bit-line | Bit-line bar | Bit-line | Bit-line bar |
| Write enable signal (or voltage) | On (Vdd) | On (Vdd) | Off (Vss) | Off (Vss) |
| Bit-lines states (pre-charge): input signal | either Hi (or Low) | either Low (or Hi) | Hi | Hi |
| Voltaget control circuit functionality | connects far end of BL to Vss only when BL is low | connects far end of BLB to Vss only when BLB is low | turn-off | turn-off |

Figure 9:
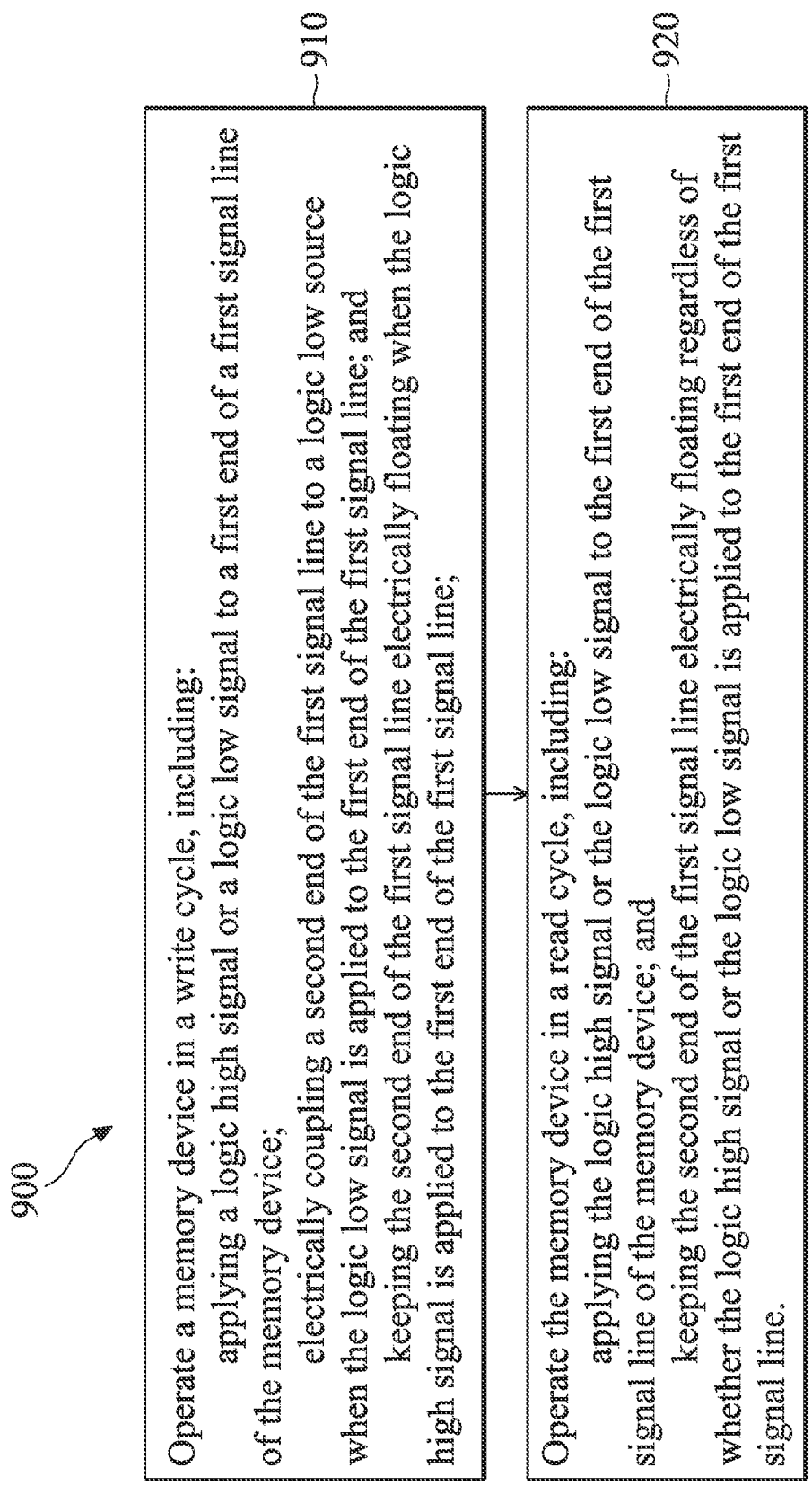
FIG. 9 illustrates a flowchart of a method of operating a memory device according to various aspects of the present disclosure.

FIG. 9 is a flowchart illustrating a method 900 of operating a memory device. The method 900 includes a step 910 to operate a memory device in a write cycle. The step 910 includes a sub-step of applying a logic high signal or a logic low signal to a first end of a first signal line of the memory device. The step 910 includes another sub-step of electrically coupling a second end of the first signal line to a logic low source when the logic low signal is applied to the first end of the first signal line. The step 910 includes another sub-step of keeping the second end of the first signal line electrically floating when the logic high signal is applied to the first end of the first signal line.

The method 900 includes a step 920 to operate the memory device in a read cycle. The step 920 includes a sub-step of applying the logic high signal or the logic low signal to the first end of the first signal line of the memory device. The step 920 includes another sub-step of keeping the second end of the first signal line electrically floating regardless of whether the logic high signal or the logic low signal is applied to the first end of the first signal line.

In some embodiments, the electrically coupling the second end of the first signal line is performed using a voltage control circuit, and the voltage control circuit is turned on during the write cycle but turned off during the read cycle.

In some embodiments, the memory device includes an array of memory cells and a plurality of edge cells located outside of the array of memory cells, and the voltage control circuit is implemented in at least one of the edge cells that is located adjacent to the second end of the first signal line.

In some embodiments, the voltage control circuit includes a plurality of pass gates. When the logic low signal is applied to the first end of the first signal line during the write cycle, a first subset of the pass gates is turned on to form an electrical connection path between the logic low source and the second end of the first signal line. When the logic high signal is applied to the first end of the first signal line during the write cycle, at least some of the pass gates in the first subset are turned off to cut off the electrical connection path between the logic low source and the second end of the first signal line.

In some embodiments, the memory device includes a second signal line that is a logic complement of the first signal line. When the logic low signal is applied to the first end of the second signal line during the write cycle, a second subset of the pass gates is turned on to form an electrical connection path between the logic low source and the second end of the second signal line. When the logic high signal is applied to the first end of the second signal line during the write cycle, at least some of the pass gates in the second subset are turned off to cut off the electrical connection path between the logic low source and the second end of the second signal line.

In some embodiments, the operating the memory device includes operating a Static Random Access Memory (SRAM) device that includes a bit line (BL) signal line as the first signal line and a bit line bar (BLB) signal line as the second signal line.

It is understood that the method 900 may include additional steps performed before, during, or after the steps 910-920. For reasons of simplicity, however, these additional steps are not discussed in detail herein.

In summary, the present disclosure implements a voltage control circuit that is selectively turned on or off to electrically connect the far end of the BL or BLB signal line of an SRAM device to Vss when appropriate. For example, during a write cycle when Vdd is applied to the near end of BL and Vss is applied to the near end of BLB, the voltage control circuit electrically connects the far end of BLB to Vss. The far end of BL may be kept electrically floating. During a write cycle when Vss is applied to the near end of BL and Vdd is applied to the near end of BLB, the voltage control circuit electrically connects the far end of BL to Vss. The far end of BLB may be kept electrically floating. A copy of the voltage control circuit may be implemented in each one of the edge cells that are located adjacent to the far end of BL or BLB.

Based on the above discussions, it can be seen that the embodiments of the present disclosure offer advantages over conventional devices. It is understood, however, that no particular advantage is required, other embodiments may offer different advantages, and that not all advantages are necessarily disclosed herein.

On advantage is improved device performance. For example, as device scaling continues, the size of SRAM array becomes greater, and meanwhile the microelectronic elements such as the width of metal lines become smaller. As a result, parasitic resistance across the length of BL or BLB signal lines is no longer negligible but may cause a substantial voltage loss as the voltage signal travels through the length of BL or BLB signal lines. This means that, in a write cycle, the SRAM cells located at the far end (i.e., away from the circuit that generates the logic signals for BL or BLB) may experience a significantly degraded signal (particularly Vss) compared to the SRAM cells located at the near end. If left unabated, such voltage loss for the far end SRAM cells could degrade device performance such as write margin or speed. The present disclosure solves this problem by implementing one or more voltage control circuits in the far end of the SRAM cell array. The voltage control circuit provides an alternative and low resistance path for BL or BLB to receive the logic signals, for example Vss. In other words, BL or BLB at the far end no longer need to receive Vss across the length of the metal line, but rather BL or BLB can receive Vss through just a few pass gates of the voltage control circuit, which is a much lower resistive path. As such, the voltage loss due to parasitic resistance at the far end of the SRAM cell array is substantially alleviated, and SRAM device performance is improved. Another advantage is that the voltage control circuit does not impact or interfere with the read cycle operations of the SRAM cell, where parasitic resistance is not a significant concern. Another advantage is the ease of implementation, since the edge cells would have been present anyway in a typical SRAM device, and thus embedding the voltage control circuit in the edge cells does not increase device area or size.

One embodiment of the present disclosure involves a memory device. The memory device includes an array of memory cells is arranged into a plurality of columns and a plurality of rows. The rows each extends in a first direction in a top view. The columns each extend in a second direction in the top view that is different from the first direction. A first signal line extends through a first column of the plurality of columns. The first signal line is electrically coupled to the memory cells in the first column. A first end portion of the first signal line is configured to receive a logic high signal from a first circuit during a first operational state of the memory device and a logic low signal from the first circuit during a second operational state of the memory device. A second circuit includes a plurality of transistors. The transistors are configured to be turned on or off to electrically couple a second end portion of the first signal line to a logic low source when the first end portion of the first signal line is configured to receive the logic low signal from the first circuit.

Another embodiment of the present disclosure involves an SRAM device. The SRAM device includes a plurality of SRAM cells, a bit line (BL) signal line and a bit line bar (BLB) signal line that each extend through the plurality of the SRAM cells in a top view, and a voltage control circuit disposed near a second end portion of the BL signal line and a second end portion of the BLB signal line. The BL signal line is configured to receive Vdd or Vss from a first end portion of the BL signal line. The BLB signal line is configured to receive Vss or Vdd from a first end portion of the BLB signal line. When the first end portion of the BL signal line receives Vss during a write cycle of the SRAM device, the voltage control circuit is turned on to electrically couple the second end portion of the BL signal line to Vss. When the first end portion of the BLB signal line receives Vss during the write cycle of the SRAM device, the voltage control circuit is turned on to electrically couple the second end portion of the BLB signal line to Vss. The voltage control circuit is configured to be turned off during a read cycle of the SRAM device to cut off an electrical connection between Vss and the second end portions of the BL and BLB signal lines.

Yet another embodiment of the present disclosure involves a method of operating a memory device. The method includes operating a memory device in a write cycle, including: applying a logic high signal or a logic low signal to a first end of a first signal line of the memory device, electrically coupling a second end of the first signal line to a logic low source when the logic low signal is applied to the first end of the first signal line, and keeping the second end of the first signal line electrically floating when the logic high signal is applied to the first end of the first signal line. The method also includes operating the memory device in a read cycle, including: applying the logic high signal or the logic low signal to the first end of the first signal line of the memory device; and keeping the second end of the first signal line electrically floating regardless of whether the logic high signal or the logic low signal is applied to the first end of the first signal line.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying, during a write cycle of a memory device, a logic signal to a first end of a first signal line, wherein the logic signal is at a first value at a first time period and at a second value at a second time period, wherein the second value is different from the first value;
configuring, during the write cycle, a voltage at a second end of the first signal line differently based on whether the logic signal is at the first value or at the second value, wherein the first end and the second end are opposite to one another;
applying, during a read cycle, the logic signal to the first end of the first signal line; and
keeping the second end of the first signal line electrically floating during the read cycle.

2. The method of claim 1, wherein during the write cycle, the first value is a logic high value corresponding to a logic 1, and the second value is a logic low value corresponding to a logic 0.

3. The method of claim 2, wherein during the write cycle, the voltage at the second end of the first signal line is configured to be electrically coupled to a logic low source when the logic signal applied to the first end of the first signal line is at the logic low value.

4. The method of claim 2, wherein during the write cycle, the voltage at the second end of the first signal line is configured to be electrically coupled to be electrically floating when the logic signal applied to the first end of the first signal line is at the logic high value.

5. The method of claim 1, wherein the second end of the first signal line is kept electrically floating throughout an entirety of the read cycle regardless of whether the logic signal is at the first value or at the second value.

6. The method of claim 1, wherein:
the memory device is operated in the write cycle in response to receiving a first value for an enable signal;
the memory device is operated in the read cycle in response to receiving a second value for the enable signal, the second value being different from the first value;
the memory device includes a control circuit that is turned on during the write cycle but turned off during the read cycle; and
the control circuit is configured to electrically couple the second end of the first signal line to a logic low source when the control circuit is turned on.

7. The method of claim 6, wherein:
the memory device includes a plurality of memory cells and a plurality of edge cells located outside of the plurality of memory cells; and
the control circuit is implemented in at least one of the edge cells that is located adjacent to the second end of the first signal line.

8. The method of claim 6, wherein the control circuit includes a plurality of pass gates, and wherein the configuring comprises:
turning on a first subset of the pass gates when the logic signal is at a logic low, such that the first subset of the pass gates form an electrical connection path between a logic low source and the second end of the first signal line; and turning off at least some of the pass gates in the first subset of the pass gates when the logic signal is at a logic high, such that the electrical connection path between the logic low source and the second end of the first signal line is cut off.

9. The method of claim 8, wherein the memory device includes a second signal line that is a logic complement of the first signal line, and wherein the method further comprises:
turning on, during the write cycle, a second subset of the pass gates, the turned-on second subset of the pass gates forming a further electrical connection path between the logic low source and a second end of the second signal line; and
turning off, during the write cycle, at least some of the pass gates in the second subset, the turned-off pass gates in the second subset of the pass gates cutting off the further electrical connection path between the logic low source and a second end of the second signal line.

10. The method of claim 9, wherein:
the memory device includes a Static Random Access Memory (SRAM) device;
the first signal line is a bit line (BL) signal line of the SRAM device; and
the second signal line is a bit line bar (BLB) signal line of the SRAM device.

11. A method, comprising:
accessing a memory device that includes a plurality of memory cells, a first signal line, a second signal line that is a logic complement of the first signal line, and a voltage control circuit; and
selectively turning on and off the voltage control circuit, such that:
when a logic high is applied to a first end of the first signal line, and a logic low is applied to a first end of the second signal line, the voltage control circuit electrically couples a second end of the second signal line to the logic low, and a second end of the first signal line is kept electrically floating; and
when a logic low is applied to the first end of the first signal line, and a logic high is applied to the first end of the second signal line, the voltage control circuit electrically couples the second end of the first signal line to the logic low, and the second end of the second signal line is kept electrically floating.

12. The method of claim 11, wherein the selectively turning on and off the voltage control circuit comprises:
turning on the voltage control circuit in response to a Write Enable signal being at the logic high; and
turning off the voltage control circuit in response to the Write Enable signal being at the logic low.

13. The method of claim 12, wherein:
the memory device includes a Static Random Access Memory (SRAM) device;
the SRAM device operates in a write cycle when the Write Enable signal is at the logic high; and
the SRAM device operates in a read cycle when the Write Enable signal is at the logic low.

14. The method of claim 12, wherein the voltage control circuit includes a pass gate that includes a gate coupled to the Write Enable signal and a source coupled to the logic low, and wherein the pass gate is activated when the Write Enable signal is at the logic high.

15. The method of claim 11, wherein:
the memory device further includes a plurality of edge cells that are disposed adjacent to the second end of the first signal line and the second end of the second signal line; and
a copy of the control circuit is implemented in each of the edge cells.

16. A method, comprising:
providing a memory device that includes an array of memory cells arranged into a plurality of rows and a plurality of columns, a plurality of first signal lines and a second signal lines, wherein each of the columns has a respective one of the first signal lines and a respective one of the second signals extending therethrough, and wherein each of the second signal lines is a logic complement of each of the first signal lines;
operating the memory device in a write cycle by:
applying a logic high or a logic low to a first end of the first signal line and to a first end of the second signal line;
electrically biasing a second end of the first signal line to the logic low when the first end of the first signal line is at the logic low; and
electrically biasing a second end of the second signal line to the logic low when the first end of the second signal line is at the logic low; and
operating the memory device in a read cycle by applying the logic high signal to the first end of the first signal line and to the first end of the second signal line.

17. The method of claim 16, wherein:
the memory device includes a Static Random Access Memory (SRAM) device;
the first signal line is a bit line (BL) signal line; and
the second signal line is a bit line bar (BLB) signal line.

18. The method of claim 16, wherein:
the memory device includes a voltage control circuit;
the operating the memory device in the write cycle comprises at least partially turning on the voltage control circuit during the write cycle; and
the operating the memory device in the read cycle comprises turning off the voltage control circuit during the read cycle.

19. The method of claim 18, wherein:
when the logic low is applied to the first end of the first signal line and the logic high is applied to the first end of the second signal line, the second end of the second signal line is kept electrically floating by partially turning off the voltage control circuit; and
when the logic high is applied to the first end of the first signal line and the logic low is applied to the first end of the second signal line, the second end of the first signal line is kept electrically floating by partially turning off the voltage control circuit.

20. The method of claim 18, wherein:
an edge cell is disposed in each of the columns near the second end of the first signal line and the second end of the second signal line; and
an instance of the control circuit is implemented in each of the edge cells.

* * * * *